United States Patent
Peng et al.

(10) Patent No.: US 7,375,980 B2
(45) Date of Patent: May 20, 2008

(54) MOUNTING APPARATUS FOR EXPANSION CARDS

(75) Inventors: Wen-Tang Peng, Tu-Cheng (TW); Jun-Xiong Zhang, Shenzhen (CN); Zhe Zhang, Shenzhen (CN); Jia-Qi Fu, Shenzhen (CN)

(73) Assignees: Hon Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 132 days.

(21) Appl. No.: 11/344,433

(22) Filed: Jan. 30, 2006

(65) Prior Publication Data

US 2006/0232952 A1 Oct. 19, 2006

(30) Foreign Application Priority Data

Apr. 15, 2005 (CN) .................. 2005 2 0057325 U

(51) Int. Cl.
*H05K 7/12* (2006.01)
(52) U.S. Cl. .................... 361/801; 361/726; 361/732; 361/740; 361/747; 361/759; 439/160
(58) Field of Classification Search ................ 361/801, 361/726, 732, 747, 759; 439/159, 160; 312/223.2
See application file for complete search history.

(56) References Cited

U.S. PATENT DOCUMENTS

| | | | | |
|---|---|---|---|---|
| 4,745,524 A | | 5/1988 | Patton, III | |
| 5,947,571 A | * | 9/1999 | Ho | 312/265.6 |
| 6,114,622 A | * | 9/2000 | Draeger | 174/384 |
| 6,118,668 A | * | 9/2000 | Scholder et al. | 361/753 |
| 6,137,839 A | * | 10/2000 | Mannering et al. | 375/260 |
| 6,320,760 B1 | * | 11/2001 | Flamm et al. | 361/801 |
| 6,480,393 B1 | | 11/2002 | Chen | |
| 6,487,070 B2 | | 11/2002 | Gan | |
| 6,552,913 B2 | * | 4/2003 | Tournadre | 361/759 |
| 6,700,791 B1 | * | 3/2004 | Zappacosta | 361/759 |
| 6,972,370 B2 | * | 12/2005 | Wang et al. | 174/535 |
| 6,985,360 B2 | * | 1/2006 | Chen et al. | 361/704 |
| 7,110,251 B2 | * | 9/2006 | Wu | 361/685 |

* cited by examiner

*Primary Examiner*—Tuan T. Dinh
*Assistant Examiner*—Dameon E Levi
(74) *Attorney, Agent, or Firm*—Morris Manning Martin LLP; Tim Tingkang Xia, Esq.

(57) ABSTRACT

A mounting apparatus for mounting a plurality of expansion cards (50) in a computer includes a chassis (10), a rack (40), a fixing member (60), and a locking member (70). The chassis includes a rear panel (12). The rack is attached to the chassis and includes a fixing plate (42) parallel to the rear panel. The fixing member is attached to the fixing plate and pivotally secures ends of the expansion cards with cover pieces (53) to the rear panel. The locking member is rotatably attached to the fixing plate of the rack and includes a plurality of hooks (715) extending therefrom. The hooks engage in apertures (51) defined in the other ends of the expansion cards.

15 Claims, 5 Drawing Sheets ed portions 531 of the cover pieces 53 of the expansion cards 50, as shown in FIG. 3.

MOUNTING APPARATUS FOR EXPANSION CARDS

BACKGROUND OF THE INVENTION

1. Field of the Invention

The present invention relates to mounting apparatuses for mounting a plurality of expansion cards in an electronic device, and particularly to a mounting apparatus which can securely mount a plurality of expansion cards in an electronic device.

Relevant subject matter is disclosed in the copending U.S. patent application Ser. No. 11/502,218, filed on Aug. 10, 2006, and entitled "AUXILIARY MOUNTING APPARATUS FOR EXPANSION CARDS", which is assigned to the same assignee as this patent application.

2. Background of the Invention

In order to upgrade the operating capabilities of a personal computer, a plurality of expansion cards is operatively installed in the computer enclosure. Typical types of expansion cards include network cards, sound cards, graphics accelerator cards and multi-media cards, etc.

U.S. Pat. No. 4,745,524 discloses a mounting mechanism for mounting a plurality of expansion cards in a computer chassis. The mounting mechanism includes a pressing element, and a screw to secure a separate cover piece of corresponding expansion card. However, the mounting mechanism only secure one ends of the expansion cards to the computer chassis. Even the expansion cards are with long dimensions, such a mounting mechanism may not stably secure the expansion cards in the computer chassis.

What is needed is to provide a mounting apparatus which can securely mount expansion cards in a computer enclosure.

SUMMARY

In a preferred embodiment, a mounting apparatus for mounting a plurality of expansion cards in a computer includes a chassis, a rack, a fixing member, and a locking member. The chassis includes a rear panel. The rack is attached to the chassis and includes a fixing plate parallel to the rear panel. The fixing member is pivotally attached to the fixing plate and secures ends of the expansion cards with cover pieces to the rear panel. The locking member is rotatably attached to the fixing plate of the rack and includes a plurality of hooks extending therefrom. The hooks engage in apertures defined in the other ends of the expansion cards.

Other advantages and novel features of the invention will become more apparent from the following detailed description when taken in conjunction with the accompanying drawings, in which:

DETAILED DESCRIPTION OF THE EMBODIMENT

Figure 1:
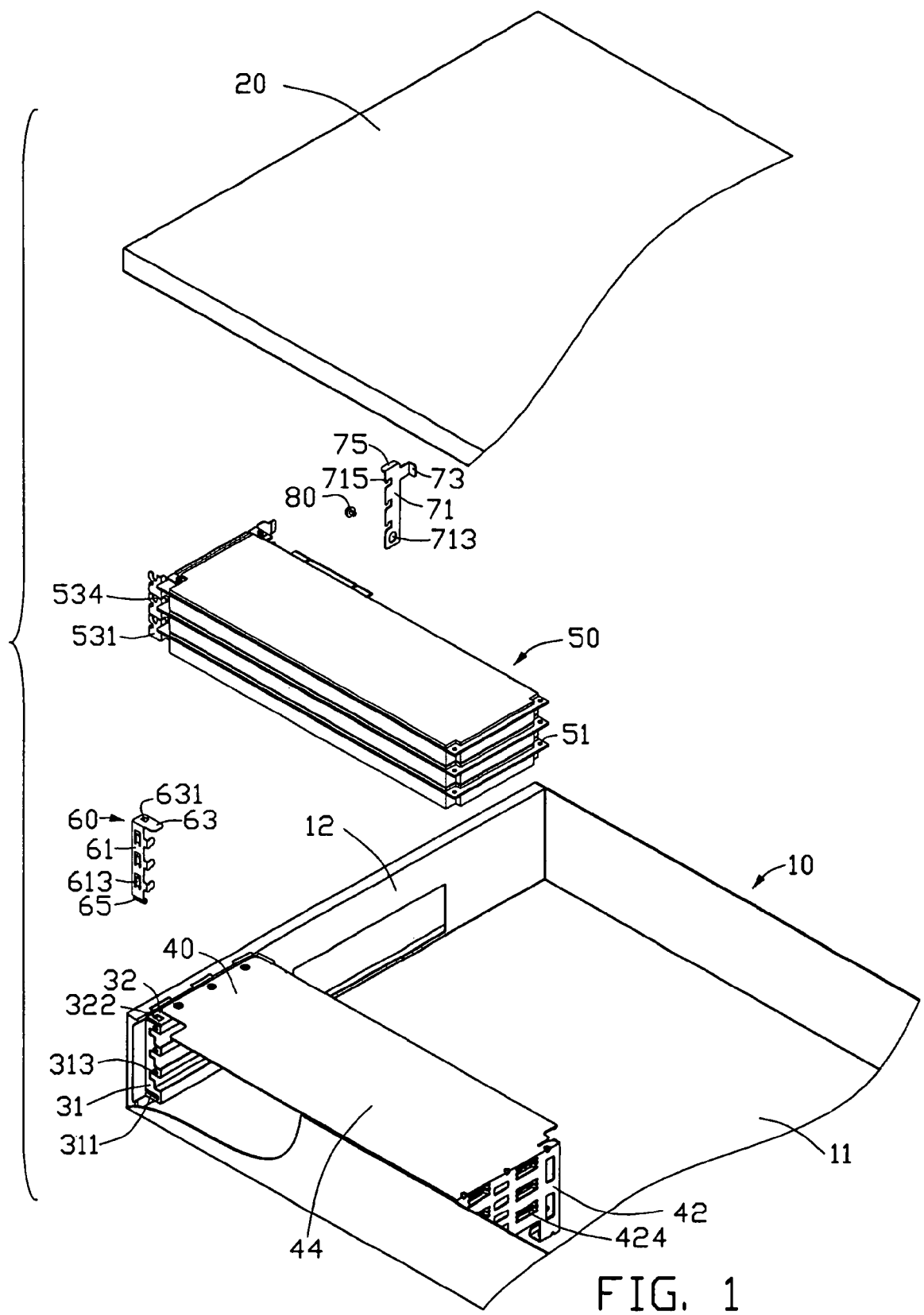
FIG. 1 is an exploded, isometric view of a mounting apparatus in accordance with a preferred embodiment of the present invention.
Figure 2:
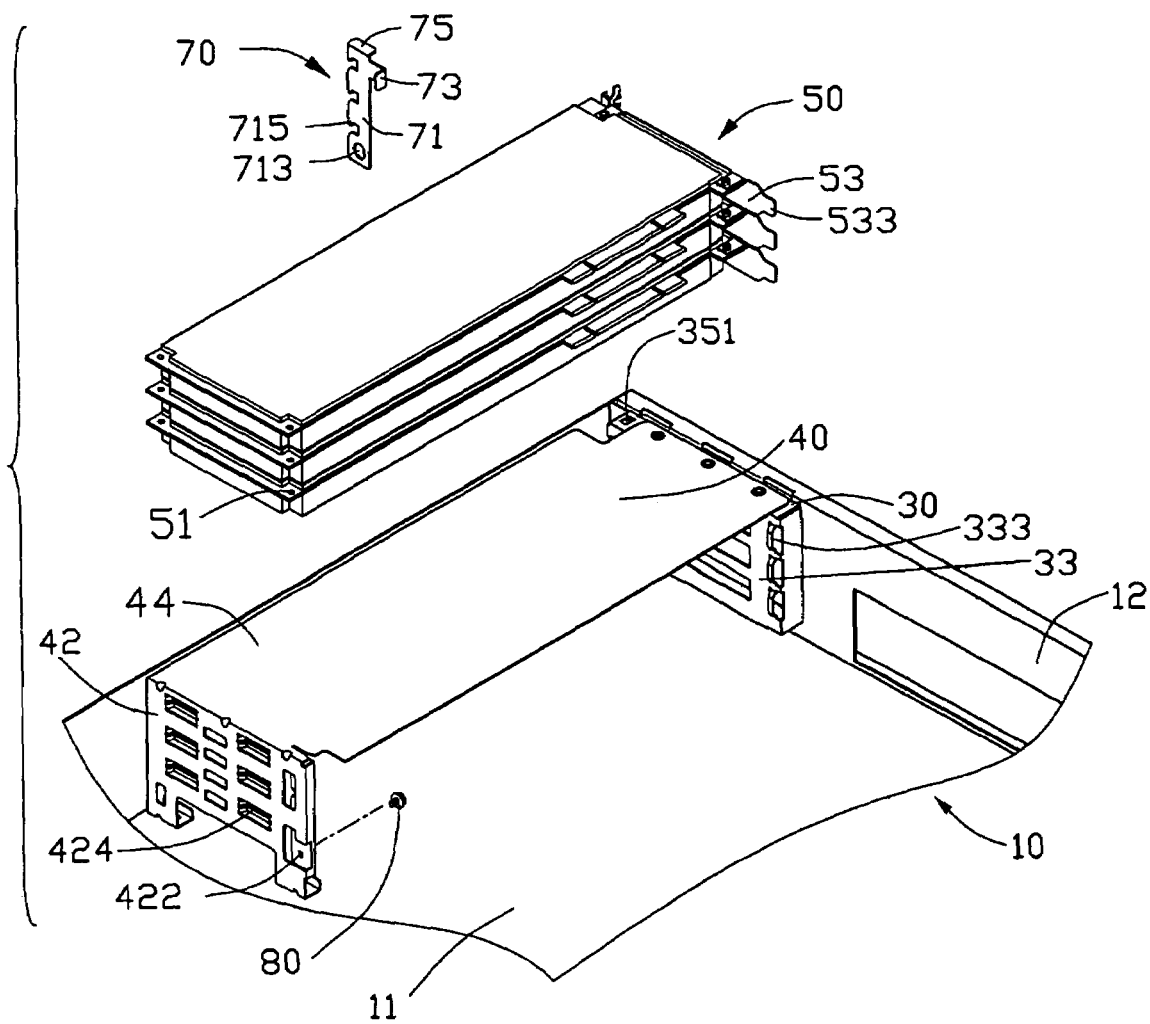
FIG. 2 is a partially, isometric view of FIG. 1, but viewed from another aspect.

Referring to FIGS. 1 and 2, a mounting apparatus of an electronic device likes a computer for securely mounting a plurality of functional parts like expansion cards 50 to the electronic device in accordance with a preferred embodiment of the present invention includes a chassis 10, a rack 40 attached to the chassis 10, a fixing member 60, and a locking member 70.

Each of the expansion cards 50 includes a cover piece 53 attached to a first end thereof, and an aperture 51 defined in a corner of a second end thereof. Each of the cover pieces 53 includes a bent portion 531 defining a notch 534 therein.

The chassis 10 includes a bottom panel 11, and a rear panel 12 perpendicular to the bottom panel 11. A supporting shelf 30 is formed on an inner side of the rear panel 12. The supporting shelf 30 includes a supporting flange 31 perpendicular to the rear panel 12, and a connecting flange 32 perpendicular to the supporting flange 31. The supporting flange 31 is for supporting the bent portions 531 of the expansion cards 50. A plurality of locating post 313 extends perpendicularly from the supporting flange 315. A first mounting slot 311 is defined in a bottom portion of the supporting flange 31. A second mounting slot 322 is defined in the connecting flange 35 near to the supporting flange 31. The chassis 10 further includes a cover 20 attached thereon.

The rack 40 includes a fixing plate 42 perpendicular to the bottom panel 11 of the chassis 10, and a top plate 44 parallel to the bottom panel 11 of the chassis 10. The fixing plate 42 defines a threaded hole 422 therein, for engaging with a thumbscrew 80. The fixing plate 42 includes a plurality pairs of protrusions 424 extending therefrom. Each pair of the protrusion 424 defines a channel (not labeled) therebetween to receive the second ends of the expansion cards 50.

The fixing member 60 includes a body 61, a mounting hook 65, and an operation part 63. The mounting hook 65 and the operation part 63 are formed at two ends of the body 61. A plurality of retaining tabs 613 extends therefrom to abut the bent portions 531 of the cover pieces 53 of the expansion cards 50 to the rack 30 of the chassis 10. A block 631 extends outwardly from the operation part 63, for engaging in the second mounting slot 322 of the shelf 30.

The locking member 70 includes a main plate 71. A plurality of hooks 715 extends from a side portion thereof, engaging in the apertures 51 of the expansion cards 50. A through hole 713 is defined in a bottom portion of the main plate 71, corresponding to the threaded hole 422 of the rack 40. The locking member 70 includes an operating tab 73 extending from an upper portion thereof, and a top board 75 extending from a top edge thereof. The top board 75 is parallel to the bottom panel 11 of the chassis 10.

Figure 3:
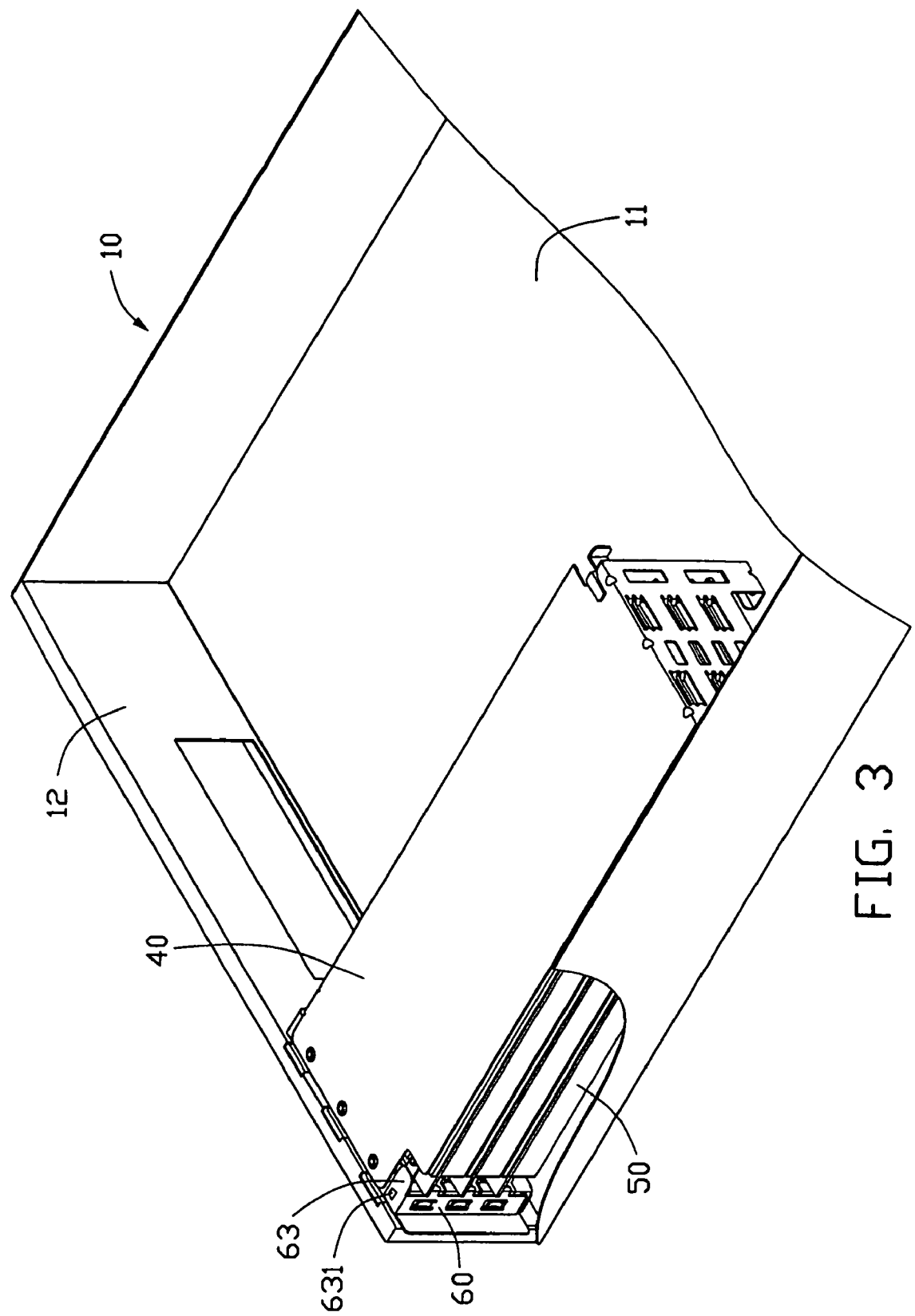
FIGS. 3 and 5 are partially assembled views of FIG. 1, and showing in an unlocked state and a locked state.
Figure 4:
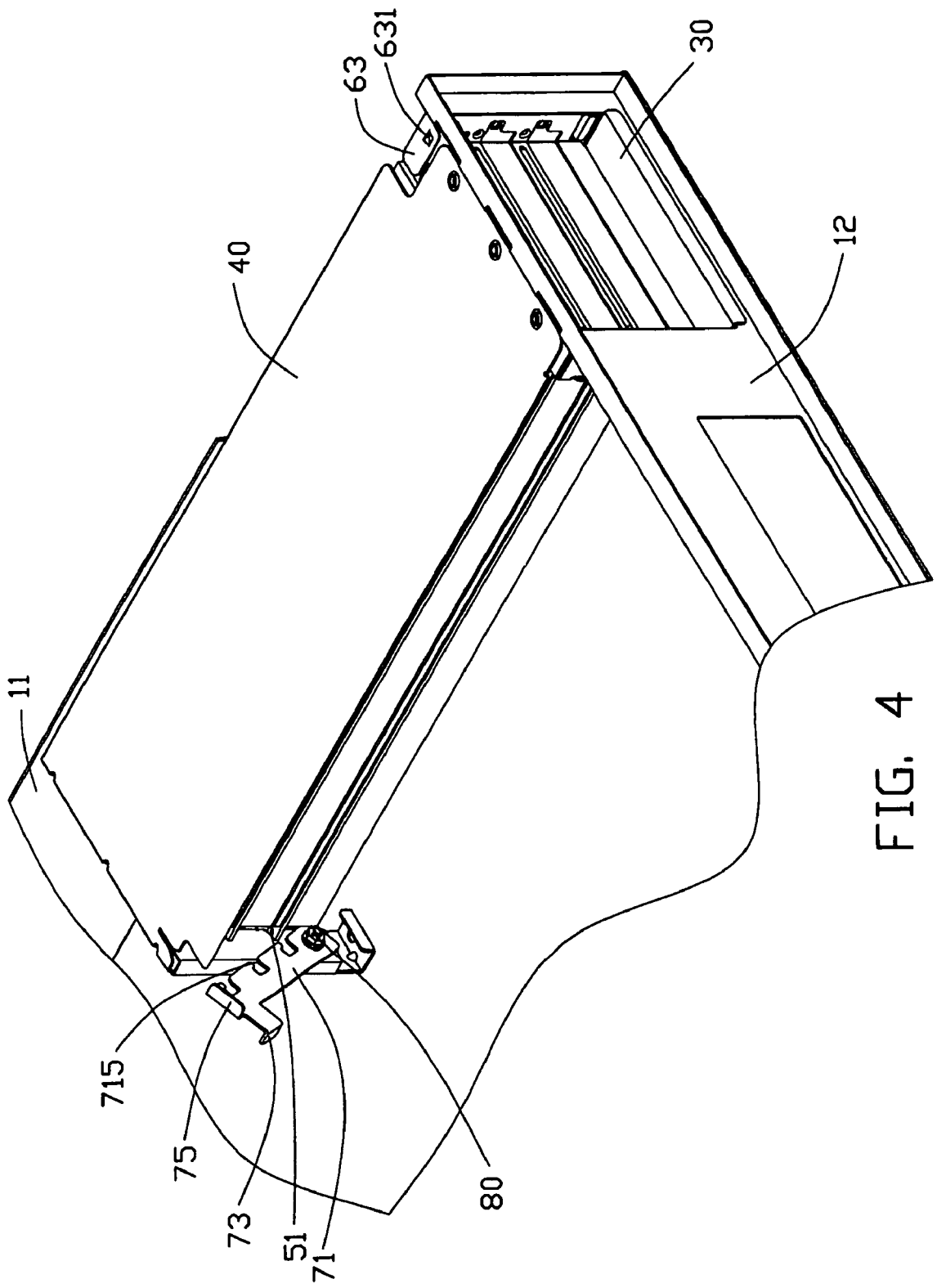
FIG. 4 is an assembled view of FIG. 1.
Figure 5:
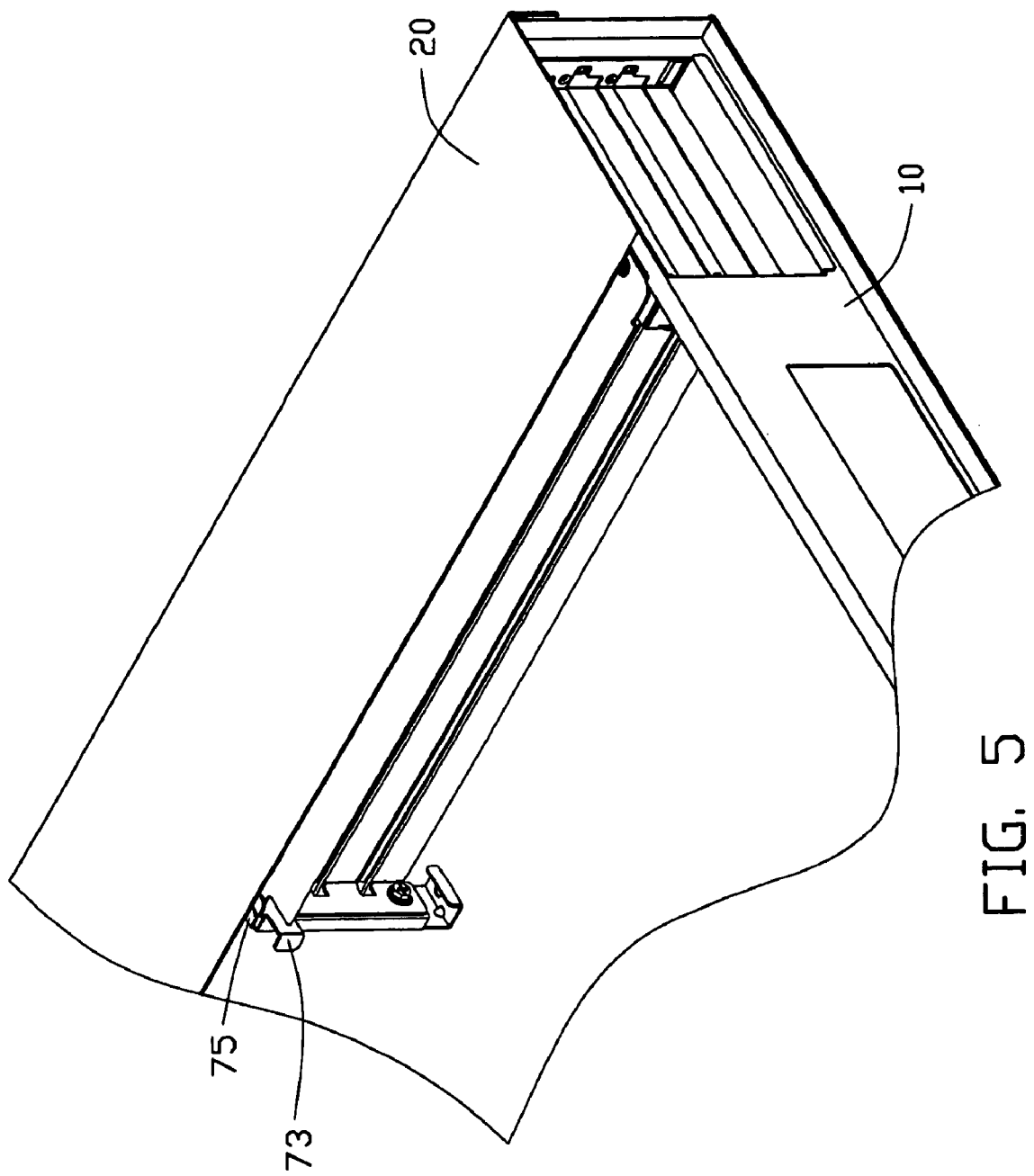

Referring also to FIGS. 3-5, in assembly, the rack 40 is attached to the chassis 10. The fixing member 60 and the locking member 70 are separately attached to the shelf 30 and the rack 40.

The mounting hook 65 of the fixing member 60 engages in the first mounting slot 311 of the shelf 30. The locking member 70 is rotably attached to the fixing plate 42 of the rack 40, with the thumb screw 80 extending through the through hole 713 thereof and engaging in the threaded hole 422 of the rack 40. The expansion cards 50 are assembled in the chassis 10. The bend portions 531 of cover pieces 53 of the expansion cards 50 are placed on the supporting flange 31 of the shelf 30, with the locating posts 313 engaging in the notches 534. The fixing member 60 is rotated about the mounting hook 65 and the resilient tabs 613 about the bent portions 531 of the expansion cards 50 to the shelf 30. The block 631 of the fixing member 60 is locked in the second mounting slot 322 of the shelf 30. Thus, the first ends of the expansion cards 50 are secured.

The second ends of expansion cards 50 are received between the protrusions 424 of the rack 40. The operating tab 73 is moved to rotate the locking member 70 so that the hooks 715 engage in the apertures 51 of the expansion cards 50. Thus, the second ends of the expansion cards 50 are secured. The cover 20 is attached on the chassis 10 and rests on the top board 75 of the locking member 70 to further secure the expansion cards 50.

In disassembling the expansion cards 50 from the chassis 10, the cover 20 is firstly removed from the chassis 10. The fixing member 60 and the locking member 70 are rotated to release the resilient tabs 613 from the bent portions 531 of the expansion cards 50 and release the hooks 715 from the apertures 51 of the expansion cards 50.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

We claim:

1. A mounting apparatus for mounting expansion cards to an electronic device, each of the expansion cards comprising a first end with a cover piece, the mounting apparatus comprising:
   a chassis including a rear panel, and a bottom panel perpendicular to the rear panel;
   a fixing member securing the first ends of the expansion cards to the rear panel, wherein a second end of the each of the expansion cards defines an aperture therein;
   a rack attached to the chassis and comprising a fixing plate perpendicular to the bottom panel of the chassis; and
   a locking member pivotally attached to the fixing plate and comprising a plurality of hooks, wherein the plurality of hooks are engaged in the apertures of the second ends of the expansion cards.

2. The mounting apparatus as claimed in claim 1, wherein the fixing plate of the rack further comprises a plurality of protrusions extending therefrom to support the second ends of the expansion cards.

3. The mounting apparatus as claimed in claim 1, wherein the fixing plates of the rack defines a through hole therein, the locking member defines a threaded hole therein, a thumb screw extends through the through hole and engages in the threaded hole.

4. The mounting apparatus as claimed in claim 3, wherein the locking member comprises a top board extending from an end portion thereof and parallel to the bottom panel of the chassis, the chassis further comprises a cover attached thereon and resting on the top board.

5. The mounting apparatus as claimed in claim 3, wherein the locking member comprises an operating tab extending perpendicularly therefrom.

6. The mounting apparatus as claimed in claim 1, wherein the rear panel of the chassis further comprises a shelf extruding from an inner surface thereof for movably attaching the fixing member thereto to secure the first ends of the expansion cards.

7. The mounting apparatus as claimed in claim 6, wherein the shelf comprises a supporting flange perpendicular to the rear panel, a connecting flange perpendicular to the supporting flange, a mounting slot is separately defined in the supporting flange and the connecting flange, the locking member comprises a hook, and a block extending therefrom to separately engage in the mounting slots.

8. A mounting apparatus for mounting an expansion card to a chassis of an electronic device, the expansion card secured to a rear panel of the chassis at a first end thereof, the mounting apparatus comprising:
   an aperture defined in a second end of the expansion card opposite to the first end, the aperture defined in a corner of the second end of the expansion card;
   a fixing plate arranged in the chassis; and
   a locking member pivotally attached to the fixing plate and comprising a hook extending therefrom and engaging in the aperture.

9. The mounting apparatus as claimed in claim 8, wherein the fixing plate is fixed to a bottom panel of the chassis and parallel to the rear panel of the chassis.

10. The mounting apparatus as claimed in claim 9, wherein the fixing plate further comprises protrusions extending therefrom to supportingly engage with the second end of the expansion card.

11. The mounting apparatus as claimed in claim 8, wherein the locking member comprises a top board extending from an end portion thereof and parallel to the bottom panel of the chassis.

12. The mounting apparatus as claimed in claim 11, wherein the locking member comprises an operating tab extending therefrom.

13. An electronic device comprising:
    at least two functional parts installable in said electronic device and capable of performing functional extension of said electronic device, said at least two functional parts extendable in said electronic device in a parallel relationship between a side panel of said electronic device to expose said at least two functional parts therefrom respectively and an interior of said electronic device;
    a fixing member attachable to said side panel of said electronic device and capable of securing said at least two functional parts to said side panel respectively; and
    a locking member installable in said interior of said electronic device beside said at least two functional parts and pivotably reachable to each of said at least two functional parts, said locking member pivoted around a shaft extending along said at least two functional parts and perpendicular to said side panel, said locking member pivotable between a first position thereof where said locking member engages with said each of said at least two functional parts to maintain said parallel relationship of said at least two functional parts together with said fixing member, and a second position thereof where said locking member pivots away from said each of said at least two functional parts to release said each of said at least two functional parts.

14. The electronic device as claimed in claim 13, wherein said locking member comprises a plurality of hooks corresponding to said at least two functional parts so as to engage with said at least two functional parts respectively.

15. The electronic device as claimed in claim 13, wherein said locking member is pivoted to a fixing plate of a rack, said fixing plate is located away from said side panel and extends parallel to said side panel.

* * * * *